(12) United States Patent
Andle

(10) Patent No.: US 9,419,334 B2
(45) Date of Patent: Aug. 16, 2016

(54) ANTENNA FOR COUPLING ESD SENSITIVE MEASUREMENT DEVICES LOCATED IN HIGH VOLTAGE ELECTRIC FIELDS

(71) Applicant: Transense Technologies PLC, Bicester, Oxfordshire (GB)

(72) Inventor: Jeffrey C. Andle, Falmouth, ME (US)

(73) Assignee: Transense Technologies PLC (GB)

( * ) Notice: Subject to any disclaimer, the term of this patent is extended or adjusted under 35 U.S.C. 154(b) by 332 days.

(21) Appl. No.: 14/346,753

(22) PCT Filed: Sep. 21, 2012

(86) PCT No.: PCT/US2012/056541
§ 371 (c)(1),
(2) Date: Mar. 24, 2014

(87) PCT Pub. No.: WO2013/044010
PCT Pub. Date: Mar. 28, 2013

(65) Prior Publication Data
US 2014/0240184 A1   Aug. 28, 2014

Related U.S. Application Data

(60) Provisional application No. 61/538,887, filed on Sep. 25, 2011.

(51) Int. Cl.
*H01Q 1/00* (2006.01)
*H01Q 1/50* (2006.01)
(Continued)

(52) U.S. Cl.
CPC .............. *H01Q 1/50* (2013.01); *G01R 29/0871* (2013.01); *G01R 29/0878* (2013.01); *H01Q 1/2216* (2013.01); *H01Q 11/08* (2013.01); *G01R 31/1272* (2013.01)

(58) Field of Classification Search
CPC ....... H01Q 11/08; H01Q 1/2216; H01Q 1/50; G01R 29/0878; G01R 29/0871; G01R 31/1272
USPC .................. 343/720, 703, 741, 843, 866, 895
See application file for complete search history.

(56) References Cited

U.S. PATENT DOCUMENTS 3,774,218 A * 11/1973 Fowler .................. H01Q 23/00
343/701
7,397,441 B1 * 7/2008 Zweers .................. H01Q 1/243
434/702

(Continued)

OTHER PUBLICATIONS

Supplemental European Search Report in EP12833943 dated May 29, 2015.

(Continued)

*Primary Examiner* — Sue A Purvis
*Assistant Examiner* — Jae Kim
(74) *Attorney, Agent, or Firm* — Keusey & Associates, P.C.

(57) ABSTRACT

A measurement device for operating in high voltage electrical fields such in high voltage electrical switchgear, having a sensor and a λ/2 monopole helical antenna coupled thereto. The antenna is coupled to a ground via return stub in lieu of the common ground plane. The antenna is made of wire having a sufficiently large diameter to prevent forming corona discharge point electrode throughout the outer surface of the volume defined by the antenna, thus minimizing corona discharge risk. The antenna further provide relative immunity from induced voltage at the 50-400 Hz range from the high voltage fields, allowing ESD sensitive devices to operate in close proximity to the high voltage conductors.

13 Claims, 3 Drawing Sheets

(51) Int. Cl.
*G01R 29/08* (2006.01)
*H01Q 1/22* (2006.01)
*H01Q 11/08* (2006.01)
*G01R 31/12* (2006.01)

(56) References Cited

U.S. PATENT DOCUMENTS

| | | |
|---|---|---|
| 2003/0091735 A1 | 5/2003 | Baumann et al. |
| 2005/0017751 A1 | 1/2005 | Gunn |
| 2006/0076838 A1 | 4/2006 | Solveson |
| 2006/0077114 A1 | 4/2006 | Planning |
| 2006/0170439 A1 | 8/2006 | Gleason et al. |
| 2007/0040544 A1 | 2/2007 | Suzuki et al. |
| 2010/0164692 A1* | 7/2010 | Nagasawa ............ G08C 17/02 340/10.5 |
| 2010/0214094 A1 | 8/2010 | Givens et al. |

OTHER PUBLICATIONS

Albert Livshitz et al, On-Line Temperature Monitoring of Power Distribution Equipment, http://ieeexplore.ieee.org/ielx5/10224/32590/01524558.pdf?tp=&arnumber=1524558&isnumber=32590, pp. 223-231, XP55066257, Sep. 12, 2005.

International Search Report and Written Opinion mailed Dec. 17, 2012, in International Stage PCT Patent Application No. PCT/US2012/056541.

* cited by examiner

Fig. 1 (Prior art)
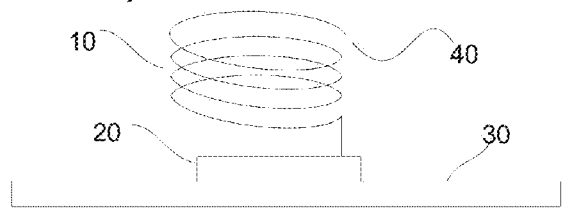
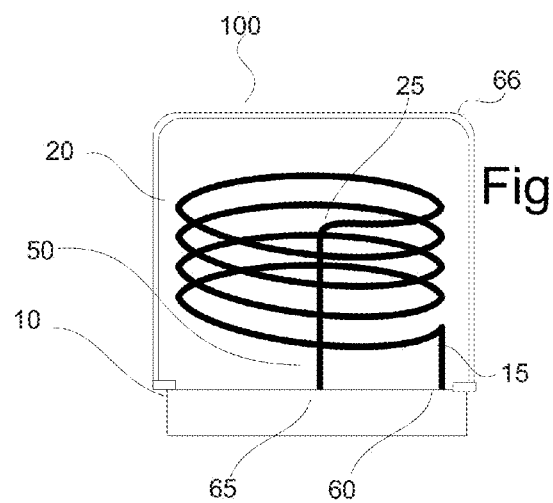
Fig. 2
Fig. 3
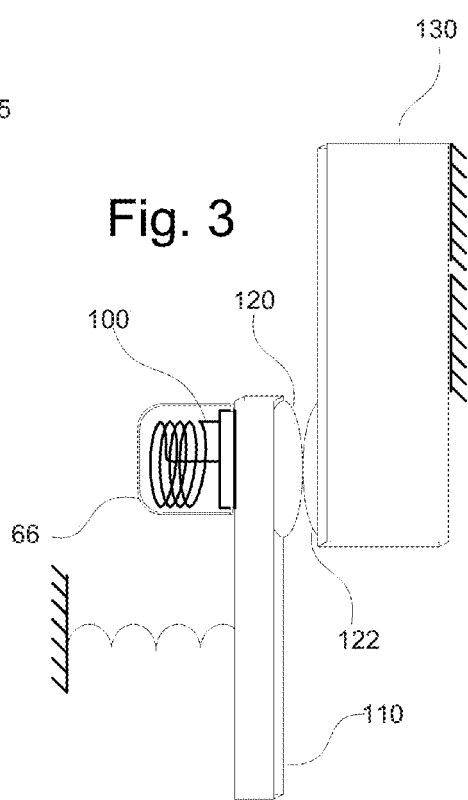

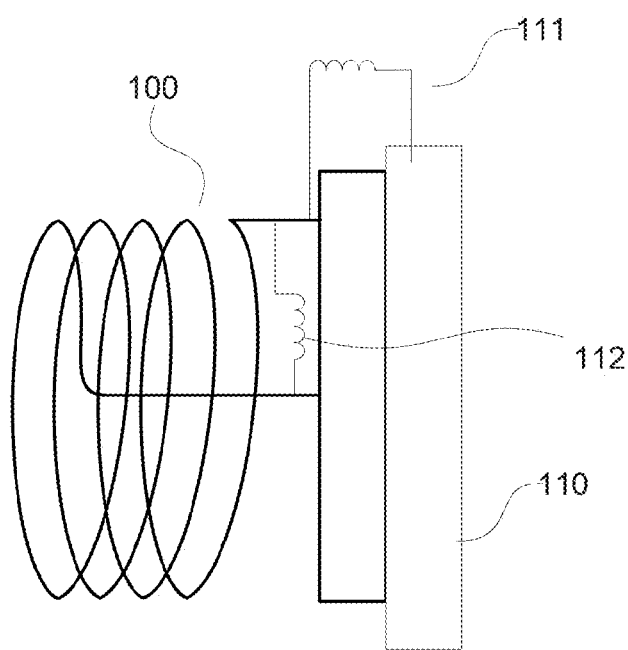

ANTENNA FOR COUPLING ESD SENSITIVE MEASUREMENT DEVICES LOCATED IN HIGH VOLTAGE ELECTRIC FIELDS

FIELD OF THE INVENTION

The invention relates to antennas for measurement devices, and more particularly to antennas for coupling electrostatic discharge sensitive devices that are located in high voltage electric fields.

BACKGROUND OF THE INVENTION

Electrical power generation and distribution, systems utilize a network of wires, connectors, transformers, and switches which are collectively known as switchgear. Reliability and efficiency of such systems are important concerns to operators—an unplanned service outage often carries with it a significant financial burden.

Energy loss in switchgear and conductors is proportional to the square of the current passing therethrough. Utilizing higher voltages causes a reduction of the current for transferring a given amount of energy. Therefore such systems utilize very high voltage ranging between several hundreds and well over a million volts. However, even at such high voltages, as the amount of energy is high, the system uses high current as well.

Generation and distribution systems are designed to have low resistance in the conductors; however aging infrastructure—especially at cable junctions and switch contacts—lead to increasing local resistance over time. The resistance increases cause local heating, which accelerates the aging of the junction or contact.

Oftentimes imminent failure of a connector or a switchgear element is generally accompanied by such elevated electrical resistance. When the electrical current transferred through the network flows through this resistance, it causes heat. Therefore, an imminent failure of a switchgear component may be predicted by elevated temperature. Other parameters such as vibration, humidity, and the like, also provide valuable data and it is often desired to perform such measurements in proximity to the relevant equipment.

Placing measurement devices in close proximity to high voltage lines presents a slew of technical problems. While temperature, humidity, acceleration and other sensors are well known, the better ones operate at low voltage, and are sensitive to electrostatic discharge. If wired sensors are used, isolating the sensors and wires from the high voltage fields in which they are required to operate is difficult, and utilities and industrial users are often unwilling to accept the associated risks even when such use is possible.

Wireless measuring devices which receive their energy from an external transmitter are well known. The measuring device generally comprises a sensor, and at least one antenna and in certain cases the sensor comprises optional circuitry for coupling between the sensing element(s) and the antenna. When exposed to a pre-set frequency signal from the transmitter, such devices re-radiate radio frequency (RF) energy, or otherwise disrupts the RF energy field, in a manner that conveys information about the parameter they are designed to measure. The re-radiated energy or field disruption is received by a receiver which allows the information to be used. This technology is colloquially known as 'passive device'. Notably, in certain embodiments the antenna may be directly coupled to the sensor and added circuitry is minimal or not required. Oftentimes, the measuring device is located on the arm of a switch or relay contact, at as small a distance as practical therefrom. In connectors, the sensor will often be in direct contact with the connector or one of the wires.

Several characteristics are desired from an antenna which is introduced to such high voltage electrical fields. Firstly, it is desirable that the antenna will have low induced voltage in the frequency of the high voltage fields, commonly known as the line frequency. This prevents exposure of the sensor to high voltages, and to varying voltages according to the instant current in the device, which may vary widely. Most power transmission in today's equipment occurs between the DC—zero frequency range—and line frequency of 400 Hz, thus it is desirable to limit the antenna induction in those frequencies. Secondly, minimizing the size of the antenna is highly desired as doing so will require minimal changes to existing switchgear design, and will very often allow for retrofitting of the sensor to existing design.

Many typical devices, most notably surface acoustic wave (SAW) resonators and delay lines, have very low immunity to electrostatic discharge (ESD) or to applied electric fields in excess of the millivolt and smaller radio frequency signals for which they are designed. Directly coupling an antenna to such devices may induce hundreds or thousands of volts of electrostatic potential at the line frequency. This electrostatic potential may be reduced by a resistive or inductive shunt protective element across the SAW device; however the shunt protective element invariably reduces the radio frequency efficiency of the sensor and decreases the distance and/or signal to noise ratio at which it can be monitored. It is desirable to employ antenna structures with little or no induced electrical potential from the power system so as to eliminate or minimize the ESD protection required.

It is also important that the antenna will present a minimum source of corona discharge. Corona discharges are disruptive as they damage insulation, create ozone and in extreme cases may cause arcing sparks, and shortage. Generally, the larger the radius of curvature and the larger the separation between conductors at different potentials, the larger a potential difference is required to initiate a corona.

Monopole antennas present a small and efficient antenna for the measuring devices. However monopole antennas generally require a ground. When dealing with radio frequency, the term 'ground' may refer to "RF ground" rather than to actual ground. RF ground refers to the potential neutral relative to an RF voltage or wave. While earth ground is often used as RF ground, such use is not a necessity. RF ground has no relationship with earth ground and a cable or contact of sufficient size might be energized to hundreds of thousands of volts relative to earth ground and still be considered RF ground. The term 'ground plane' refers to the plane from which ground reflections may be considered to take place, i.e. the term relates to an electrical counterpoise or object which acts similar to a grounded object for purposes of radiation relative to the antenna.

A straight monopole antenna is often impractical within the confines of a switchgear device, especially when located within the confine of a spark arrestor, or the like. Helical monopole antennas are known, where the required electrical length—an odd integer multiple of quarter wavelengths ($\lambda$/4)—is formed into a coil. FIG. 1 represents an example of such conventional design. A length of wire is wound to a coil 10, and is connected on one side to the measurement device 20, while the other side terminates in a high impedance at a point 40. A relatively large metal element 30 acts as a ground plane and point 40 is capacitively coupled to said ground plane as is the length of the coil itself through parasitic capacitance of the surrounding medium, typically air. The skilled in the art would recognize that the ground plane adds significant bulk to the device, and that the point 40 acts as a point electrode which increases the potential for corona discharge between the antenna distal end and surrounding objects.

There is therefore, a long and heretofore unfulfilled need in the art, for an efficient antenna design which will occupy a relatively small volume, without utilizing corona discharge prone point electrodes, and generally protected from corona discharge.

SUMMARY OF THE INVENTION

It is an object of the present invention to provide a solution to the shortcoming of the prior art designs for antennas and/or measuring devices which operate at high voltage electrical fields.

It is an object of the invention to provide such measurement device having high efficiency and small size antenna. It is a further object of the invention to provide a measurement device which provides an antenna which minimizes the risk of corona discharge between the antenna and surrounding objects. Furthermore, it is an object of the invention to provide such antenna that will have low induced voltage from the high voltage electric fields at the line frequency, so as to protect the electrostatic discharge sensitive measurement device.

These specifications utilize a contact arm of a switchgear operating within a high voltage distribution network by way of convenient explanatory example. It will be clear to the skilled in the art that the contact arm is but one item that may be monitored by the present invention. Other items may include contact terminals, wire connectors, conductors, bus bars, rectifiers, inverters, solenoids, motors, trip mechanisms, measurement devices, transformers, measurement devices, or any other element of the high voltage distribution network which is exposed to the high voltage environment. Therefore, the term 'contact arm' should be extended to such items, and an term 'item' as used in the claims, should extend to the contact arm as well as all other items or portions thereof as described above.

It is a further object to provide a generally isotropic radiation pattern without sacrificing radiation efficiency per volume figure of merit of the antenna.

To those ends there is provided a measurement device for measuring at least one physical parameter of an item disposed in high voltage electric field, comprising a sensor and an antenna coupled thereto, and a return stub having a proximal end and a distal end. The sensor having at least a first and a second terminals, and being in physical proximity to a high voltage network item to be measured.

The preferred antenna comprises a coil made of a wire having a sufficiently large wire diameter to prevent forming corona discharge point electrode throughout the outer surface of the volume defined by the antenna. One coil end is electrically coupled to the first terminal, and the other end is coupled to the distal end of the return stub. The proximal end of the return stub is coupled to the second terminal of the sensor. The electrical length of the antenna, inclusive of the return stub, matching network, and connecting assemblies, is an integer multiple of half wavelengths $\lambda/2$. The skilled in the art will recognize that the interchangeable terms 'electrical length' and 'effective length' should be construed as the physical length of an ideal wire antenna which, when having a 'speed of light' along the wire equal to the speed of light in a vacuum and coupled directly to the sensor, presents equivalent phase shift, and therefore resonance conditions at the sensor operating frequency, as would be presented by the combination of antenna, together with any matching network, if utilized, to which the electrical length relates. The skilled in the art will readily appreciate that self inductance and fringing field capacitance always reduces the propagation speed along a wire relative to the speed in free space, making the physical length shorter than the electrical length. The skilled in the art will also recognize that reactive matching networks incur phase shift and that the electrical phase of the matching network can contribute to the overall resonant phase shift of the antenna system.

A coil having a diameter smaller than one tenth of the free space wavelength of the antenna electrical resonant operating frequency results in all of the windings of the coil being within each other's reactive near field, such that the coil does not become a circularly polarized end-fired antenna. By maintaining a small coil diameter, the coil provides a broadside radiation pattern similar to an electrically long antenna, such as a quarter wavelength monopole, or a half wavelength dipole.

Therefore one aspect of the invention provides a measurement device for measuring at least one physical parameter of an item forming a portion of a high voltage distribution network, the device having a sensor coupled to the item, the sensor having a first and a second antenna terminals, the sensor characterized by an antenna electrically coupled to the sensor. The antenna comprises a conductive coil having a proximal end and a distal end, the proximal end of the coil being electrically coupled to the first terminal. A conductive stub having a proximal end and a distal end is provided, the proximal end of the stub being electrically coupled to the second terminal, and the distal end of the stub being electrically coupled to the distal end of the coil. The stub and the antenna may be formed integrally, such as being formed of a single wire. The coil wire diameter is sufficiently large to prevent forming corona discharge point electrode throughout the outer surface of the volume defined by the antenna, at the operating voltage to which the antenna is exposed in operation, preferably larger than 0.5 mm, and more preferably about 1 mm. In some embodiments, the coil pitch is larger than twice the coil wire diameter. Furthermore, the coil diameter is smaller than one tenth of the free space wavelength of the resonant frequency of the antenna.

The above described structure results in an antenna in which the mutual inductance and mutual capacitance formed between the coil turns provides an equivalent electrical length which is longer than the physical length of a simple wire antenna. Therefore, an antenna constructed in accordance with the above described structure allows obtaining similar results to a simple wire antenna, while utilizing shorter physical wire length and thus the coil occupies a smaller volume.

Optionally, a matching network is coupled between the antenna and the sensor, allowing utilization of a smaller coil while maintaining the effective electrical length of an integer multiple of a half wavelength, in free-space, of the measuring device operating frequency.

Preferably, a low impedance electrical path is provided between the antenna and the measured item. The coupling is provided such that it presents low impedance path at the operating frequency of the switchgear item to be measured.

In some embodiments the stub is located within the coil volume and in other embodiments the stub is located outside the coil volume. In one preferred embodiment, the return stub is wholly or partially disposed within a radiating shield, such as to form a short transmission line. In such an embodiment the shield is preferably coupled to RF ground at the resonant frequency of the antenna.

Preferably, the measured high voltage network item is a contact disposed within a switchgear unit.

In another aspect of the invention there is provided a system for measuring at least one parameter of an item forming a portion of a high voltage distribution network, the system comprising at least one measurement device as described herein, disposed in sufficient proximity to the item to be measured so as to sense the at least one measured parameter. An interrogation transmitter configured to transmit an interrogation signal to the measurement device is also provided. A receiver configured to receive information from the measurement device, responsive to the interrogation signal, is also provided. The interrogation receiver being electrically isolated from the high voltage of the high voltage network. The system further comprises a computing device coupled to the receiver, and configured to monitor the information, record the information, display the information, or any combination thereof. In some embodiments the interrogation signal is utilized to energize measurement device. At least the antenna of the interrogation transmitter and the receiver are located in sufficient proximity to the measurement device's antenna as to transmit and receive efficiently. Preferably, if the item to be measured is within a high voltage switchgear enclosure, the transmitting/receiving antenna, which are often combined in one antenna, are disposed within the enclosure. In some embodiments the interrogation transmitter and/or receiver are located within the enclosure and in some they are located outside the enclosure, communicating through an RF-transparent aperture of the enclosure or via antenna located within the enclosure. In yet other embodiments, such as outdoor switchyards, the transmitting and receiving antennas of the interrogator and the sensor with its antenna are all located in an exposed environment.

There is also provided a method for communicating with a sensor disposed in close proximity or within a high voltage environment, the method comprising:
  providing a measurement device as described herein;
  sending an interrogation signal from an interrogation transmitter to the measurement device;
  in a receiver, receiving information from the measurement device, responsive to the interrogation signal, the interrogation receiver being electrically isolated from the high voltage of the high voltage network; and,
  performing one or more of the steps of monitoring the information, recording the information, and, displaying the information.

Other steps such as interpreting the information, transmitting the information, and the like are also contemplated.

In some embodiments of all aspects, a cap made of dielectric material is provided, the cap encompasses at least a portion of the coil. Besides acting to physically protect the antenna, the cap may provide several additional advantages. Notably, the cap would provide distributed dielectric load which allows shorter physical antenna length. The cap may also increase protection against arcing, and act to minimize dielectric loads from surrounding objects.

In a preferred embodiment of the invention there is provided a passive sensor coupled to an antenna comprising a wire having a portion formed as a coil, and a portion formed as a return stub. An end of the coil portion is coupled to a first terminal of the sensor and an end of the stub is coupled to a second terminal of the sensor. The sensor further comprises an acoustic wave device, and an antenna matching network. The coil wire diameter is sufficiently large to prevent forming corona discharge point electrode throughout the outer surface of the volume defined by the antenna, at the operating voltage to which the antenna is exposed in operation. The wire diameter is about 1 mm. The coil pitch is larger than twice the coil wire diameter. Furthermore, the coil radius is smaller than one tenth of the free space wavelength of the resonant frequency of the antenna. The electrical length of the coil, stub, and matching network is a small integer multiple of half a wavelength. Preferably the multiple is one. An insulating cap encompasses the volume defined by the antenna. The antenna construction results in a an antenna with a radiation pattern similar to a monopole antenna, in which the mutual inductance and mutual capacitance formed between the coil turns provides an equivalent wire electrical length which is longer than the physical length of a simple wire antenna together with a separate and equivalent matching network. Furthermore, the cap provides additional dielectric loading of the coil. Therefore, an antenna constructed in accordance with the above described structure allows obtaining similar results to a simple wire antenna or coil wire antenna, while utilizing shorter physical wire length and thus the coil occupies a smaller volume.

SHORT DESCRIPTION OF DRAWINGS

The summary above, and the following detailed description will be better understood in view of the enclosed drawings which depict details of preferred embodiments. It should however be noted that the invention is not limited to the precise arrangement shown in the drawings and that the drawings are provided merely as examples.

FIG. 1 depicts a simplified diagram of a measurement device having an antenna according to the prior art.

FIG. 2 depicts one embodiment showing the antenna and a stub disposed within the volume of the coil.

FIG. 3 depicts a simplified diagram of a measuring device coupled to a contact arm within switchgear.

FIG. 7 depicts a simplified schematic diagram of a simple network providing low impedance path between the measurement device and the high voltage carrying item to be measured.

DETAILED DESCRIPTION

Figure 4:
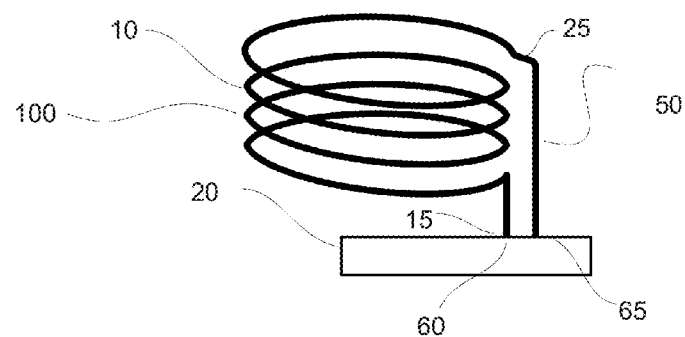
FIG. 4 depicts an embodiment in which the stub is disposed outside of the coil volume.

Below there is provided a more detailed description of several embodiments of aspects of the invention, by way of non-limiting examples.

Even though in common electrical systems the range from 600V to about 66 kV is considered 'Medium Voltage', in these specifications the term 'High Voltage' shall relate to any voltage above 600V. The term 'measurement device shall relate to a device adapted to operate within the influence of high voltage electric fields, and comprising at least a sensor and at least one antenna. The sensor is adapted to measure at least one parameter of a connection point of high voltage connection equipment, such as switches, contactors, connectors, relays, rectifiers, inverters, transformers, and the like. Optionally the sensor further contains coupling circuitry to couple to the antenna. By way of non-limiting example, coupling circuitry may include impedance matching circuitry, active electronic components, passive electronic components, and the like.

It is well known that if an object carrying high voltage charge has a point shape portion or a sharp edge, the charge around this point will have relatively steep charge gradient as compared to the more evenly distributed flat surface. Such a point shaped or sharp edge is related to in these specifications as a point electrode and will tend to enhance the risk of creating a corona discharge or arcing.

The antenna wire will have sufficient diameter to minimize the risk of corona discharge if the radius of curvature of all conductors forming the outer boundary of the coil meets guidelines established by the IEC or other standards body for the voltage level of the electrical circuit. For typical switchgear up to at least 33 kV a 0.25 mm radius of curvature (0.5 mm wire diameter) is acceptable. Up to about 66 kV, a 0.5 mm radius of curvature (1 mm wire diameter) is acceptable. At higher voltages, an even larger radius of curvature is required.

The antenna wire should also not terminate at a point away from the power system conductor as the charge gradient, and the associated corona discharge risk, will be maximized at the abrupt end of the wire.

FIG. 2 depicts a measuring device 100 in accordance with an embodiment of the invention. Sensor 10 has two terminals 60 and 65. Terminal 60 is connected to a proximal end 15 of an antenna formed as a coil 20. While a helical coil is shown, other forms are also acceptable as long as they do not form sharp point electrodes which may cause corona. As known, the coil, together with the effects of any matching network if used, has an electrical length which is preferably a multiple of half wave lengths of the sensor operating frequency, or a close approximation thereof. In many embodiments, especially those where the antenna operating frequency is between 100 MHz and 2.5 GHz, a single half wavelength is preferred. In this frequency range the electrical wavelength is large compared to the required electrical insulation spacing commonly required in electrical power systems. Therefore, by coiling the antenna to shorten the physical length, it is possible to fit within the confines dictated by the insulation spacing common in the industry. Preferably, the antenna electrical wavelength is of a single half wavelength. If an electrical matching network is used, the physical length of the wire is reduced by the amount of equivalent electrical length provided by the matching network at the antenna operating frequency, as known.

The distal end 25 of the antenna is coupled to a return stub 50. The return stub is a short conductor providing a return path from the distal end of the coil. The stub may comprise a simple wire, a coaxial transmission line, or other low impedance path to RF ground. Preferably the stub has a very short length compared to the wavelength λ and thus radiation therefrom is minimized. The stub provides a low impedance path to the second terminal 65 of the sensor, and further provides differential coupling of the radio frequency signal between terminals 60 and 65, and thus obviates the need for a ground plane.

This arrangement causes the antenna impedance to be almost completely based on self inductance of the windings and parasitic capacitance between the coil windings, whereas the prior art is based on self inductance of the windings and parasitic capacitance from the coil to a physical ground plane. The resulting antenna is compact and efficient. The design acts similar to a monopole antenna without the requirement for a large ground plane. The antenna is also very efficient, presenting a comparable peak efficiency per volume of a comparably sized helical monopole. The antenna further has a more isotropic radiation pattern. As the antenna does not have an abrupt end distal from the high voltage conductor, the risk for corona discharge is significantly reduced.

An additional advantage of the antenna disclosed herein, is that the impedance of the antenna changes much less with changes in the ground plane than the prior art antenna, which is dependent to a large extent by the power system cable geometry. In simplest principles, both antennas may be modeled as series resonant circuits consisting of a radiation resistance, the self inductance and the distributed capacitance. Since the prior art antenna capacitance is dependent on the ground plane, changes to the ground plane change the reactance and therefore the optimal operating frequency of the monopole. In extreme cases the radiation resistance also changes.

It is noted however that dielectric and inductive loading stemming from the effects of nearby surrounding structure may also effect the antenna impedance and effective electric length. This may cause changes in matching the antenna to the sensor and other changes in the antenna characteristics if the switchgear object to be measured is not stationary. The term 'dielectric loading' shall be used hereinafter to denote the combination of dielectric and inductive load effecting the antenna impedance and effective electrical length, stemming from structures in the vicinity of the antenna.

Optionally, a cap 66 is provided to at least substantially encompass the coil. The cap provides several advantages. Firstly, it provides mechanical protection to the antenna. However, the preferred embodiment utilizes a cap comprising dielectric material. The dielectric material provides dielectric loading to the antenna. As explained supra, under the principle of operation of the present invention, the impedance of the antenna is driven primarily by the self-inductance of the coil windings as well as the parasitic capacitance. The dielectric loading provided by the cap changes the parasitic capacitance, and thus offers further reduction in the antenna size. If the cap is made of a material with dielectric strength larger than the operating voltage it further reduces the risk of arcing. Moreover, the electric loading provided to the antenna by the adjacent cap provides effective shielding from further dielectric loading from other portions of the switchgear, thus assuring more reliable operation of the device in varying conditions. The dielectric loading of the cap on the antenna may be computed, but is believed best to be determined empirically.

As known, conducting elements may be placed adjacent to the antenna to increase directionality, for greater gain in a specific direction(s) (Not shown). Furthermore, electrical systems contain many conductors whose placement is selected for the requirements of the power system and not necessarily for the operation of ancillary sensors. Such conductors form fringing capacitances to the coil, altering its resonant frequency and impedance. The dielectric cap reduces the fringing fields to neighboring metal, diverting these fields within the cap dielectric, and reducing the impact of nearby conductors on antenna operation relative to an uncapped antenna.

When coupled to a resonant sensor such as a SAW resonator, a common principle of operation is to determine the series resonant frequency of the sensor by the strength of the received signal or by Fourier transformation of the received signal. Significant changes in the antenna reactance have the effect of adversely tuning the SAW resonant frequency— colloquially termed "load pull".

Resonant sensors rely on the loaded Q of the resonator being sufficiently high. The Q is considered as inclusive of the radiation resistance of the antenna and any losses in the coupling and matching circuit. Energy is radiated over a range of frequencies near resonance, and is stored in the resonance at the resonant frequency. When the transmit signal ends, the stored energy dissipates in the resonator and circuitry, or is radiated out of the antenna. Significant variations in antenna radiation resistance lead to variable performance including reduced ability to interrogate the sensor.

Since the antenna disclosed herein relies primarily on self-mutual capacitance and inductance, its reactance is less dependent on the existence of a ground plane. Load pull due to positional effects and neighboring objects is thus significantly reduced, and the radiation resistance also suffers much less variability.

The physical height of the antenna is dependent on the coil diameter and the pitch of the coils. Oftentimes, the coil diameter is limited by available space in a specific application of the sensor. As the coil pitch must be in a range providing a suitable antenna efficiency, there are constraints on the height of an antenna providing the requisite length of $\lambda/2$ for resonance. In some applications there is insufficient clearance for a coil having an electrical length of $\lambda/2$ by itself. In such cases, as well as for other engineering choices, coils of shorter physical length may be employed, while using a matching network. The use of matching networks for antennas is well known, and a simple reactive element matching can make a physically shorter antenna meet the required resonance conditions, by way of example. As stated above, the electrical length of the antenna relates to the equivalent length of an antenna connected to the sensor, and comprising the actual length of the antenna, combined with the capacitive, resistive, and inductive effects of any matching networks if such are used, and the effects stemming from the structure of the antenna itself, as experienced at the operating frequency of the sensor.

Preferably, the new antenna shall be used in the radiative near field, that is at distances greater than $\lambda/8$ (62.5 mm at the 433 MHz ISM band) and preferably greater than $\lambda/4$ physical length (175 mm at the 433 MHz ISM band) and less than a few wavelengths (about 2000 mm at the 433 MHz ISM band). These distances are appropriate to electrical power switchgear and to wireless passive sensors using low power (<10 dBm) ISM band interrogation.

FIG. 3 depicts an exemplary application of the measuring device, employed to measure an operating parameter of a contact arm in a high voltage contactor. Contact 122 is disposed on stationary conductor 130. Contact 120 is disposed on spring-loaded contact arm 110. Measuring device 100 is mounted to the contact arm and its passive reflection of radio frequency interrogation signals provides information about the measurand of interest, such as temperature, humidity, vibration, and the like. It is noted that the measuring device is useful when mounted on, or proximally to, any conductor or portion of switchgear where high voltage electric fields are present.

FIG. 4 depicts a measurement device 100 having an antenna design where the stub 50 is disposed outside of the volume defined by the coil 10. This construction may be desired in certain applications.

Figure 5:
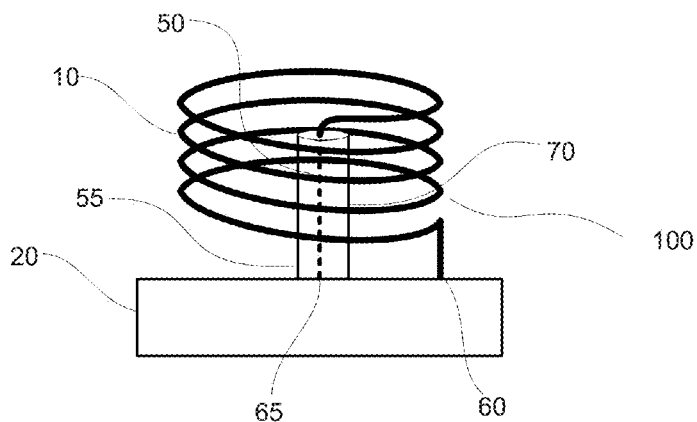
FIG. 5 depicts an embodiment in which the stub is disposed within a radiation shield.

In a preferred embodiment, the return stub 50 or a portion thereof, is disposed within a radiation shield 55 as depicted in FIG. 5. Preferably, the radiation shield is connected to the measuring device terminal 60. Even without connecting the shield to terminal 60 the existence of a uniform shield forms an RF ground plane reducing the RF reception of the stub. This is advantageous since current induced in the stub is opposite that induced in the coil. In some embodiments the shield is left electrically floating so as to form a parasitic resonance of the antenna, offering broader bandwidth. In other embodiments it is connected to terminal 60 to electrically shield the stub at RF ground. In still other embodiments it is operably coupled to terminal 60 at the sensor frequencies, but operably coupled to another circuit at other frequencies. While the edge of the radiation shield may indeed be a source of corona discharge if standing alone, the coil creates a structure similar to a Faraday cage about the shield edge, protecting the shield. Similarly, the coil provides Faraday cage protection to any electrical devices of components enclosed within its volume.

Figure 6:
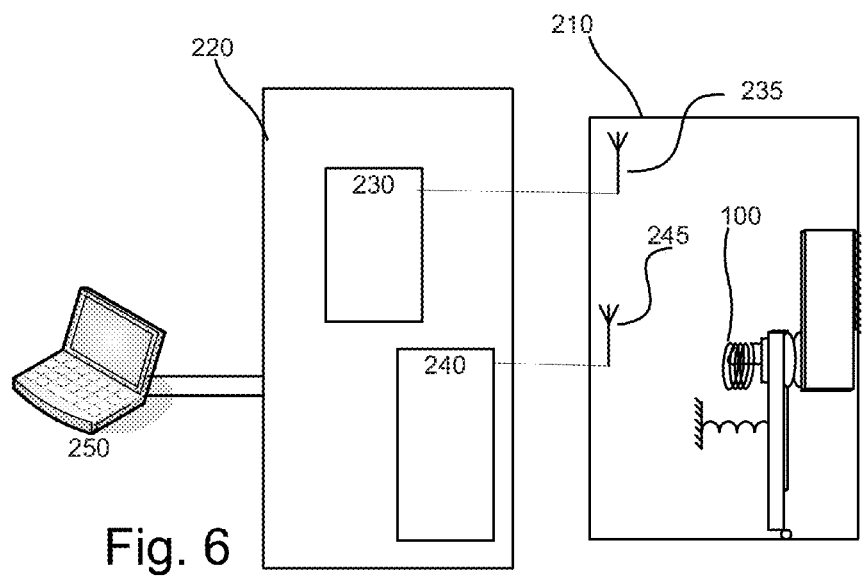
FIG. 6 depicts a block diagram of a system utilizing any of the measurement devices to monitor the measurand measured by the sensor.

FIG. 6 depicts a simplified block diagram of a measurement and/or monitoring system. A measuring device 100 is disposed in close proximity or on the high-voltage equipment to be monitored, a switchgear 210 contract arm in the depicted example. A transmitter 230 tuned to the sensor operating frequency transmits a signal, which is received by the antenna of measuring device 100 and re-radiated to be captured by receiver 240. The operation of the interrogating unit 220 may be self controlled or may be controlled by computing device 250. The data may be displayed, logged, monitored for preset conditions, or any combination thereof. Typically transmitter 230 and receiver 240 are integrated within the same device, sharing a common antenna, power source, and other circuit elements. Either a circulator is used to extract reflected signals from the transmitted signals in continuous time backscatter or a pitch-catch system is used with resonant or delay line sensors such that an RF switch toggles between transmit and receive functions. In many embodiments transmit antenna 235 and receive antenna 245 are located in the same enclosure 210 as the measuring device 100, as shown.

In a preferred embodiment the sensor is a piezoelectric Acoustic Wave Device (AWD) based temperature sensor. AWD's are especially easily suitable for the measuring device. Being resonant by their nature, and offering resonant Q exceeding 5000 at the popular 433 MHz ISM band, AWD's can be easily adapted to re-radiate the received energy without the need for additional resonant circuit, batteries, or energy harvesting. As their characteristics such as frequency and phase relationship are often dependent on the ambient conditions, changes in those conditions will be directly reflected in the re-radiated signal. Therefore AWD's offer a simple and inexpensive construction of the measuring device. Similarly, Micro Electro-Mechanical systems (MEMS) sensors are also very suitable for use under the invention. In addition to piezoelectric devices, electrostrictive and other means of coupling the energy into a high Q resonant device are contemplated. Similarly, a reflective delay line is known in the prior art in which a signal is inserted into a one port AWD and partial reflections occur at nanosecond to microsecond time delays, therefore incorporating RFID technology into the device. Similarly, embodiments of the present invention may be advantageously utilized with silicon chip based systems.

In its intended use, the sensor with its associated circuitry and antenna are operated in high tension switchgear. Thus they are exposed to high level of electric fields at the line frequency of the network, which in turn may expose the measurement device to ESD damage. To mitigate such damage, a low impedance path at the line frequency may be provided between the measurement device, and the item being measured, or another item exposed to the high voltage. FIG. 7 depicts a simplified schematic arrangement, where the antenna is coupled to the contact arm 110 via a highly generalized inductive element 111 presenting an effective short circuit at 400 Hz and below. Similarly, differential ESD protection may be obtained by similarly generalized inductive element 112. The skilled in the art would readily recognize that such a low impedance path may be achieved by a plurality of common circuits which are well known, and include any low-pass filter which acts to substantially equalize the potentials of the antenna and the high voltages line operating frequency, yet act optionally as a high impedance at the antenna and/or sensor operating frequency. The term 'low impedance' as relating to the path between the item being measured and the measurement device should be construed as sufficiently low impedance so as to prevent damage to the measuring device due to potential difference between any portion thereof and the item to be measured, and is a matter of technical choice limited primarily by the utilized equipment. In some embodiments element 111 is a short circuit and element 112 is optional. Even though the item being measured may be at thousands of volts with respect to earth ground, the measurement device forms part of the item and, by being maintained in contact, is protected against voltage differences.

In some embodiments, the sensor consists of a metallic base in contact with a metallic item whose temperature is to be measured. A printed circuit board is affixed to the metallic base, with the printed circuit board having an Acoustic Wave Device (AWD) based sensor, a shunt resistive or inductive ESD diverting element, and a series inductive or capacitive matching element. The entire printed circuit board assembly is then enclosed by a plastic cap. The series inductive device, in combination with parasitic capacitance of the printed circuit boards and AWD sensor, provides additional phase shift. Through judicious choice of the parasitic capacitances and matching inductance, it is possible to introduce significant additional phase shift, allowing a substantial reduction in height of the antenna, while also presenting the desired impedance to the AWD sensor.

In field tests, the traditional ¼λ helically-shortened monopole radiative near field performance was directly compared to the new ½λ helical antenna with return stub in accordance with the invention. The two antennas were designed to have comparable volume and are seen to have comparable overall system efficiency when used in sensor modules with sensors of the same unloaded Q (typically 5000). No statistically significant sensitivity difference was found between ¼λ helically-shortened monopoles and ½λ helical antennas with return stub. The ¼λ helically-shortened monopole had shown well-defined polarization and easily located nulls in the radiation pattern. The ½λ helical antenna with ground return stub have shown almost no null direction of coupling to the reference antenna. This is particularly advantageous since electrical switchgear often act as random radio frequency environments, and do not provide for ideal transmission paths between sensor and interrogator antennas. The position and orientation of sensors and interrogator antennas is dictated first by electrical safety and clearance distances and only secondly by radio frequency necessity. Eliminating nulls in the radiation pattern simplifies installation and presents a significant commercial advantage.

It is noted that the invention is equally applicable to high voltage systems which use either direct or alternating current.

It will be appreciated that the invention is not limited to what has been described hereinabove merely by way of example. While there have been described what are at present considered to be the preferred embodiments of this invention, it will be obvious to those skilled in the art that various other embodiments, changes, and modifications may be made therein without departing from the spirit or scope of this invention and that it is, therefore, aimed to cover all such changes and modifications as fall within the true spirit and scope of the invention, for which letters patent is applied.

The invention claimed is:

1. A measurement device for measuring at least one physical parameter of an item disposed in a high voltage electric field, the device comprising:
a sensor coupled to the item, the sensor having a first and a second antenna terminals, the sensor characterized by an antenna galvanically connected to the sensor, the antenna comprising:
a conductive coil having a proximal end and a distal end, the proximal end of the coil being galvanically connected to the first terminal;
a stub having a proximal end and a distal end, the proximal end of the stub being galvanically connected to the second terminal, and the distal end of the stub being galvanically connected to the distal end of the coil;
wherein the coil comprises wire having wire diameter sufficiently large to prevent forming corona discharge point electrode throughout the outer surface of the volume defined by the antenna, at the operating voltage to which the antenna is exposed in operation; and,
wherein the coil diameter is smaller than one tenth of the free space wavelength of the resonant frequency of the antenna.

2. The device as claimed in claim 1, wherein the antenna and the stub are formed integrally.

3. The device as claimed in claim 1, wherein the coil wire diameter is larger than 0.5 mm.

4. The device as claimed in claim 1, further comprising a matching network coupled between the antenna and the sensor.

5. The device as claimed in claim 1, further comprising a cap comprising insulating material, and encompassing at least a portion of the coil, such that the cap exerts dielectric loading on the antenna.

6. The device as claimed in claim 1, further comprising a low impedance electrical path between the antenna and the item.

7. The device as claimed in claim 1, wherein the stub is located within the volume encompassed by the coil.

8. The device as claimed in claim 1, further comprising a radiation shield, and wherein the stub is at least partially disposed within the radiation shield, forming a transmission line therewith.

9. The device as claimed in claim 1, wherein the item is contact disposed within a switchgear unit.

10. The device as claimed in claim 1, wherein the sensor comprises one or more acoustic wave devices.

11. A system for measuring at least one parameter of an item forming a portion of a high voltage distribution network, the system comprising:
a measurement device including a sensor coupled to the item, the sensor having a first and a second antenna terminals, the sensor characterized by an antenna galvanically connected to the sensor, the antenna comprising: a conductive coil having a proximal end and a distal end, the proximal end of the coil being galvanically connected to the first terminal; a stub having a proximal end and a distal end, the proximal end of the stub being galvanically connected to the second terminal, and the distal end of the stub being galvanically connected to the distal end of the coil; wherein the coil comprises wire having wire diameter sufficiently large to prevent forming corona discharge point electrode throughout the outer surface of the volume defined by the antenna, at the operating voltage to which the antenna is exposed in operation; and wherein the coil diameter is smaller than one tenth of the free space wavelength of the resonant frequency of the antenna; and
disposed in sufficient proximity to the item to sense the at least one measured parameter;

an interrogation transmitter configured to transmit an interrogation signal to the measurement device;

a receiver configured to receive information from the measurement device, responsive to the interrogation signal, the interrogation receiver being electrically isolated from the high voltage of the high voltage network; and, a computing device coupled to the receiver, and configured to: monitor the information, record the information, display the information, or any combination thereof.

12. The system as claimed in claim 11, wherein the interrogation signal detected by the antenna is utilized to energize measurement device.

13. A method for communicating with a sensor disposed in close proximity or within a high voltage environment, the method comprising:

providing a measurement device having a sensor coupled to the item, the sensor having a first and a second antenna terminals, the sensor characterized by an antenna galvanically connected to the sensor, the antenna comprising: (i) a conductive coil having a proximal end and a distal end, the proximal end of the coil being galvanically connected to the first terminal; (ii) a stub having a proximal end and a distal end, the proximal end of the stub being galvanically connected to the second terminal, and the distal end of the stub being galvanically connected to the distal end of the coil; wherein the coil comprises wire having wire diameter sufficiently large to prevent forming corona discharge point electrode throughout the outer surface of the volume defined by the antenna, at the operating voltage to which the antenna is exposed in operation;

and, wherein the coil diameter is smaller than one tenth of the free space wavelength of the resonant frequency of the antenna;

sending an interrogation signal from an interrogation transmitter, to the measurement device;

in a receiver, receiving information from the measurement device, responsive to the interrogation signal, the interrogation receiver being electrically isolated from the high voltage of the high voltage network; and performing one or more of the steps of monitoring the information, recording the information, and, displaying the information.

* * * * *